(12) United States Patent
Bass et al.

(10) Patent No.: US 6,519,947 B1
(45) Date of Patent: Feb. 18, 2003

(54) THERMOELECTRIC MODULE WITH FUNNELED HEAT FLUX

(75) Inventors: John C. Bass, La Jolla, CA (US); Daniel T. Allen, San Diego, CA (US); Norbert B. Elsner, La Jolla, CA (US)

(73) Assignee: Hi-Z Technology, Inc., San Diego, CA (US)

( * ) Notice: Subject to any disclaimer, the term of this patent is extended or adjusted under 35 U.S.C. 154(b) by 0 days.

(21) Appl. No.: 09/919,246

(22) Filed: Jul. 31, 2001

(51) Int. Cl.[7] ............................................. F25B 21/02
(52) U.S. Cl. .................. 62/3.2; 62/3.3; 62/3.7
(58) Field of Search ............................. 62/3.2, 3.3, 36, 62/3.7, 259.2; 361/699

(56) References Cited

U.S. PATENT DOCUMENTS

| | | | | |
|---|---|---|---|---|
| 5,436,467 A | * | 7/1995 | Elsner et al. | 257/15 |
| 5,550,387 A | * | 8/1996 | Elsner et al. | 257/15 |
| 5,856,210 A | * | 1/1999 | Leavitt et al. | 438/55 |
| 5,892,656 A | * | 4/1999 | Bass | 361/699 |
| 6,019,098 A | * | 2/2000 | Bass et al. | 126/344 |

* cited by examiner

*Primary Examiner*—Denise L. Esquivel
*Assistant Examiner*—Melvin Jones
(74) *Attorney, Agent, or Firm*—John R. Ross; John R. Ross, III

(57) ABSTRACT

A low-cost thermoelectric module utilizing a greatly reduced quantity of thermoelectric material as compared to similar prior art thermoelectric modules. An egg crate design containing thermoelectric elements is utilized in the present invention. However, the walls of the egg crate in the parts of the module separating the thermoelectric elements are made thick so that the total cross sectional area of the elements is less than 75 percent of the total module cross sectional area. The spaces above and below the elements are filled with a high heat and electric conducting material such as aluminum. This produces funnel-shaped conductors funneling heat and electric current into and out of each of the thermoelectric elements. The payoff to this approach is that the heat flux through the hot and cold module surfaces can be maintained while producing the same power output with about half the thermoelectric material or less. Avoiding any significant increase in heat flux through the module surface means avoiding increases in temperature drops normally encountered at the module surfaces.

14 Claims, 7 Drawing Sheets

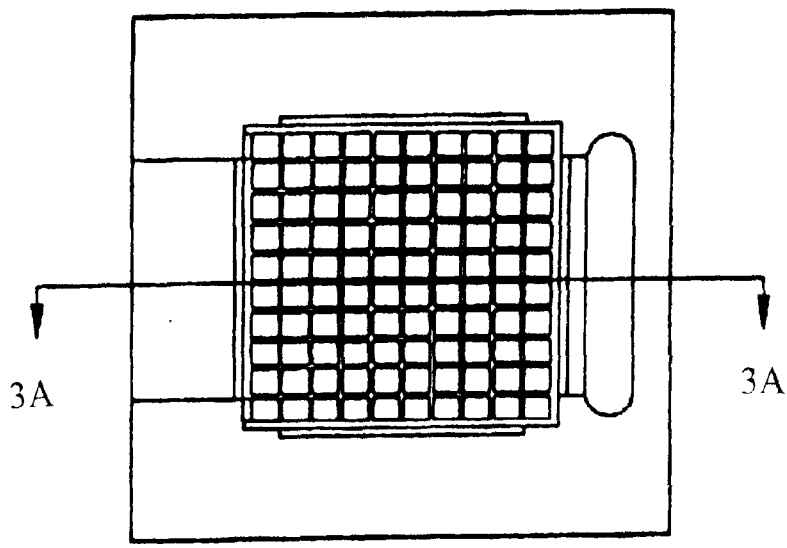
FIG. 3B
FIG. 3A
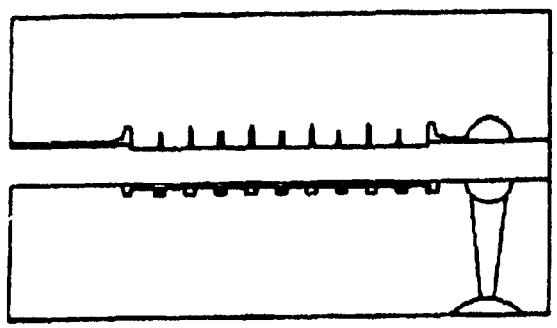
FIG. 4A
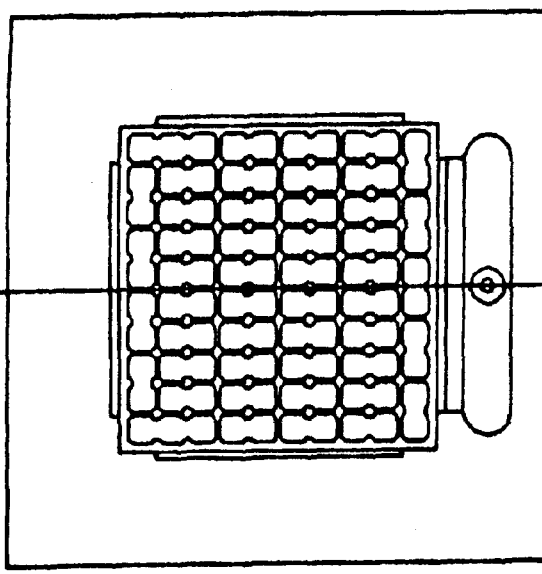
FIG. 4B

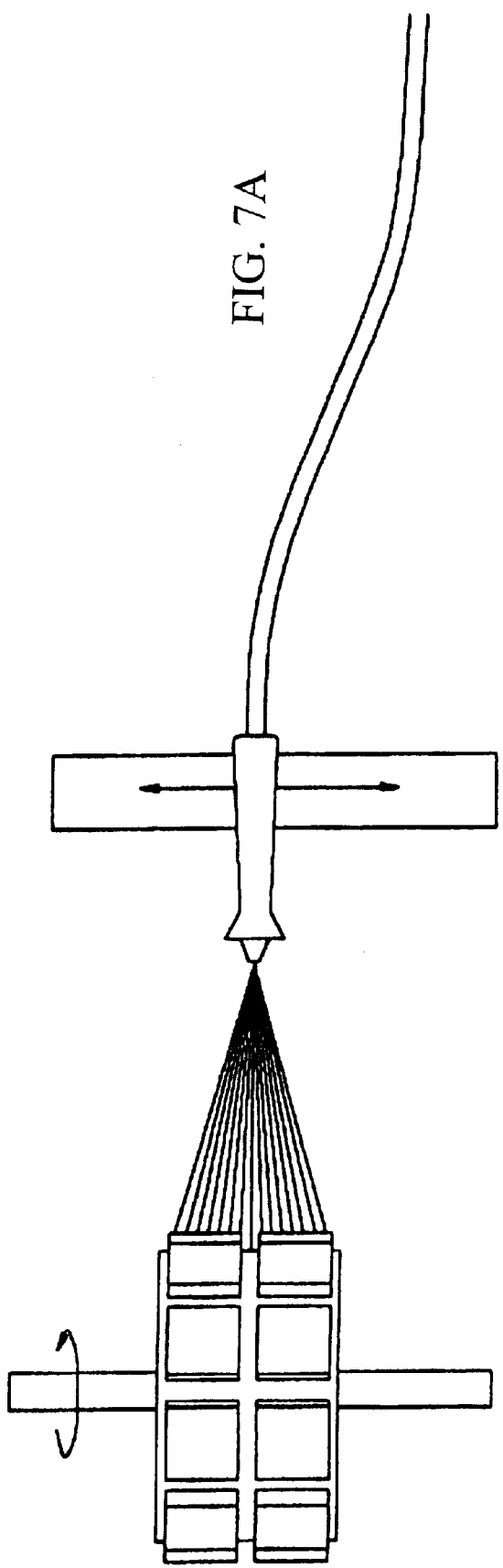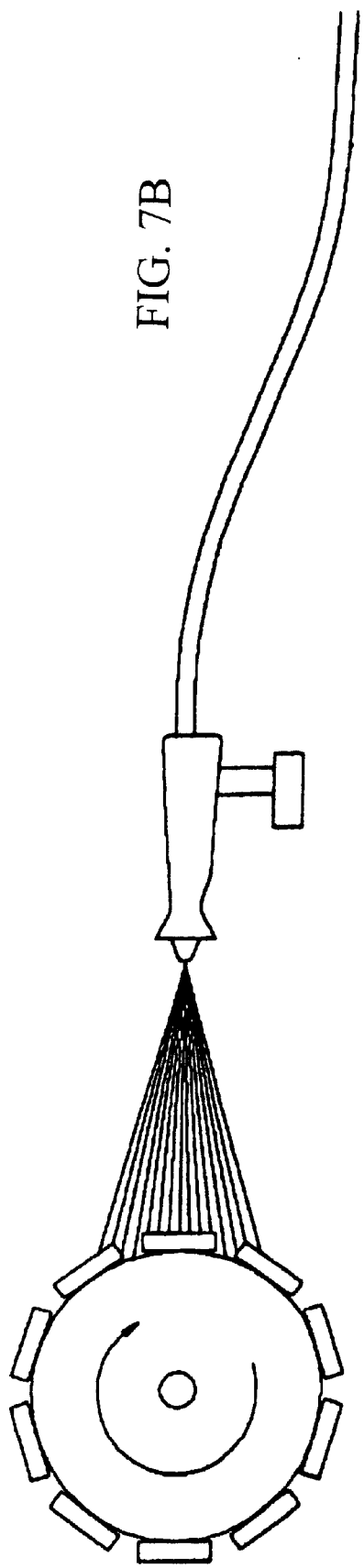

THERMOELECTRIC MODULE WITH FUNNELED HEAT FLUX

This invention relates to thermoelectric modules and especially to low cost thermoelectric modules.

BACKGROUND OF THE INVENTION

Thermoelectric devices for cooling and heating and the generation of electricity have been known for many years. A well-known technique for generating electric power is to arrange thermoelectric elements in an egg crate type module. A very successful method of making egg crate type thermoelectric modules is described in detail in U.S. Pat. No. 5,856,210 that is incorporated by reference herein. For the convenience of the reader, some of the figures from that patent have been included in this application as FIGS. 1A and B and FIGS. 3A through 7. Thermoelectric modules of the type shown in FIGS. 1A, B and C are used to convert waste heat into electricity. Since the heat energy is waste energy, one might think the resulting electrical energy is free. Such is not the case. The reason is that the cost of producing the thermoelectric module has in the past been greater than the value of the electric energy it would produce throughout its expected life. For this reason, thermoelectric modules have been utilized for the most part in situations where conventional electric power is not readily available.

It is generally believed that if the cost of thermoelectric modules can be reduced enough so that the module cost is less than the cost of the amount of conventional electricity corresponding to the electricity they would generate in a reasonable period of time, the market for these modules would increase enormously.

In this module design shown in FIGS. 1A, B and C, there are spaces for 100 elements. In some cases the two elements at the location of the electrical leads 61 and 62 of the module are shorted to make a better lead connection leaving 98 active elements. Electric current is produced by the temperature difference between the hot and cold sides of the module. The elements of the thermoelectric module are called "p legs" and "n legs" which are arranged in a checkerboard pattern and are usually connected electrically in series. Current flows from the hot side to the cold side through the n legs and from the cold side to the hot side in the p legs. Each leg of the '210 module typically produces a potential of only about 16 millivolts (under design load) with a temperature difference of about 200 degrees C. Since the 100 legs are in series the module operates at about 1.6 Volts and produces 13 Watts of electrical power. In typical applications the thermoelectric module is sandwiched between a hot metallic surface and a cold metallic surface. An electric insulator is usually used between the hot and cold surfaces of the thermoelectric module and the hot and cold metallic surfaces to prevent electric shorting. This insulator can be either a ceramic such as $Al_2O_3$, BN or a plastic such as Kapton. These insulators are often used in conjunction with a thermal grease such as silicone oil filled with a ceramic powder such a BN or ZnO. Several companies also offer preformed compliant insulators that can be used in place of the ceramic insulators. Also, a pressure is usually applied to the module insulator system that can range from 5 lbs/in² to 200 lbs/in² depending on the insulator system used. This pressure is applied to minimize the thermal contact resistance between the heat transfer surfaces and the thermoelectric module. This thermal resistance across each of the electrical insulator gaps results in temperature drops on both the hot and cold sides of the module that decreases the overall system efficiency. This temperature drop can vary from near zero to 30° C. or 40° C. or more on each side of the module, depending on the material used, the applied pressure and the heat flux flowing through the module. The single greatest cost of most egg crate type thermoelectric modules is the cost of the thermoelectric material making up the n and p legs. These elements represent about 40 to 60 percent of the cost of the module.

A good thermoelectric material is measured by its "figure of merrit or Z defined as:

$$Z = S^2/\rho K$$

where S is the Seebeck coefficient, $\rho$ is the electrical resistivity, and K is the thermal conductivity. The Seebeck coefficient is further defined as the ratio of the open-circuit voltage to the temperature difference between the hot and cold junctions of a circuit exhibiting the Seebeck effect, or $$S = V/(T_h - T_c).$$

Therefore, a good thermoelectric material is a material with large values of S and low values of $\rho$ and K.

Thermoelectric materials currently in use today include the materials listed below with their figures of merit shown:

| Thermoelectric Material | Peak Zeta, Z (at temperature shown) | ZT |
| --- | --- | --- |
| Lead Telluride | $1.8 \times 10^{-3}/°$ K. at 500° K. | 0.9 |
| Bismuth Telluride | $3.2 \times 10^{-3}/°$ K. at 300° K. | 1.0 |
| Silicon germanium | $0.8 \times 10^{-3}/°$ K. at 1100° K. | 0.9 |

Prior art thermoelectric elements making up n and p legs are typically in the shape of rectangular prisms as indicated in FIGS. 1A, B and C. The walls of the egg crate typically have been made as thin as feasible taking into consideration structural and electrical insulation requirements.

What is needed is a less costly thermoelectric module.

SUMMARY OF THE INVENTION

The present invention provides a low-cost thermoelectric module utilizing a greatly reduced quantity of thermoelectric material as compared to similar prior art thermoelectric modules. This reduction is accomplished by taking advantage of a known but not utilized relationship that permits a substantial reduction in the quantity of thermoelectric material in a module without any significant reduction in the efficiency, voltage or power output of the module. An egg crate design is utilized in the present invention. However, contrary to prior art the walls of the egg crate in the parts of the module separating the thermoelectric elements are much thicker so that the total cross sectional area of the elements is less than 75 percent of the total module cross sectional area. In a preferred embodiment the cross sectional area of the elements is only about 50 percent of the total module cross sectional area. Above and below the thermoelectric elements the walls of the egg crate are tapered becoming very thin at the top and bottom of the eggcrate. The spaces above and below the elements are filled with a high heat and electric conducting material such as aluminum. This produces funnel-shaped conductors funneling heat and electric current into and out of each of the thermoelectric elements. In a preferred embodiment a module that is the same size as a popular prior art module uses only 44 percent as much expensive thermoelectric material with no significant reduction in performance. The module has the same number of elements but each element is much smaller than the elements in the prior art module. As a consequence of the funnel-shaped conductors, approximately the same amount of heat flows through the smaller thermoelectric elements as compared to the prior art standard size elements. The payoff to this approach is that the heat flux through the hot and cold whole module surfaces can be maintained while producing the same power output with about half the thermoelectric material or less. Avoiding any significant increase in heat flux through the whole module surface means avoiding increases in temperature drops normally encountered at the hot and cold module surfaces. This invention produces a module cost reduction of about 30 percent as measured in cost per Watt of thermoelectric generating capacity.

BRIEF DESCRIPTION OF THE DRAWINGS

FIGS. 3 through 7B are prior art drawings showing that the present module including its egg crate is fabricated in substantially the same manner as described in a prior art patent.

DETAILED DESCRIPTION OF PREFERRED EMBODIMENTS

The present invention can be described by reference to the drawings.

T/E Power is Proportional to the Ratio l/A for the Element

The recognized authority on thermoelectric theory is A F Ioffe, *Poluprovodnikovye Termoelementy*, USSR Academy of Sciences, Mowscow 1956; Translated in *Semiconductor Thermoelements and Thermoelectric Cooling*, Infosearch Limited, London 1957. In Chapter 2 of the translation, Dr. Ioffe develops the equations for generator power and thermoelectric efficiency. There he observes that the equations for thermoelectric efficiency contain only the properties of the materials of the thermoelectric elements and the hot and cold temperatures and not the dimensions of the elements. Power output depends on material properties, the hot and cold temperatures and the electrical resistance of the elements. Electrical resistance is a function of the material electrical resistivity and the ratio of element length to cross sectional area.

Applicants and many others have been making thermoelectric modules for more than 30 years. Egg crates of the general type shown in the above referred to figures have been the preferred structure for the modules. The walls of these egg crates have in the past been made as thin as practicable taking into consideration electrical insulation and structural requirements. The idea was to minimize transfer of heat through the structure of the egg crate which transfer would reduce the conversion efficiency of the module.

Need to Reduce Cost

Applicants were recently offered a specific opportunity to drastically increase their sales of thermoelectric modules if only they could reduce the price of the modules by about 30 percent while maintaining module lifetime and quality. A price reduction of 30 percent was not feasible unless the quantity of thermoelectric material in a module could be reduced substantially without a substantial decrease in performance. A smaller module could be designed which would produce the same power and use less material. But such a design would cause increased heat flux across the whole module and produce much higher surface interface temperature drops. The present invention solves the problem by maintaining the same module size but reducing substantially the size of the thermoelectric elements. Thermal funnels (made from high heat conduction aluminum) transport heat from the hot surface to the elements and from the elements to the cold surface. So the heat flux across the whole module surface and the interface at the module surface, both hot and cold, does not increase.

Low Cost Design

Figure 2A:
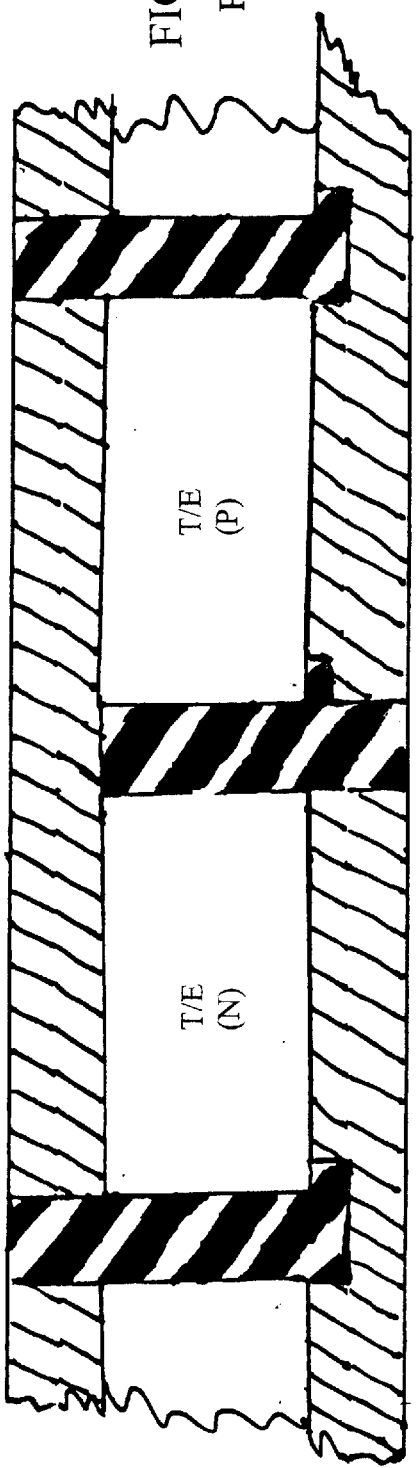
FIGS. 2A and 2B compare two legs of a module in accordance with the present invention to two legs of the above prior art module.
Figure 2B:
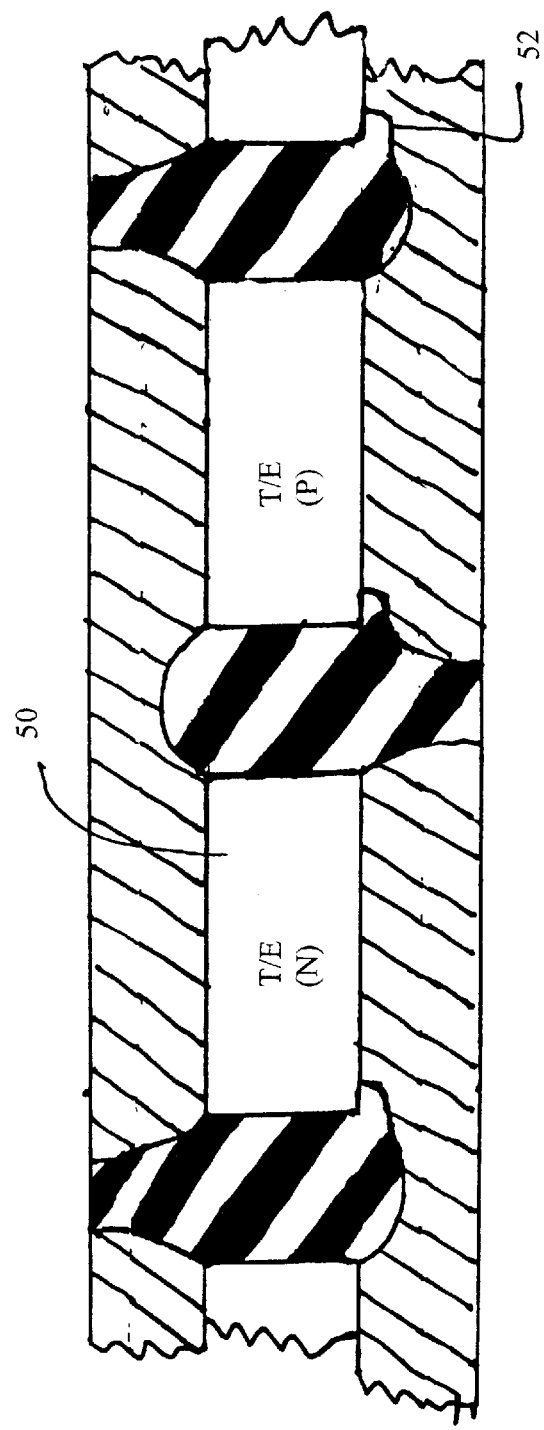

FIG. 2A shows a thermoelectric couple consisting of an n leg and a p leg of the Applicant's prior art module. FIG. 2B shows a substantially equivalent couple of a module of the present invention. Both produce substantially the same amount of electric power under exactly the same conditions. A FIG. 2B-type module contains the same number of thermoelectric elements as a 2A-type module and the modules are the same size and in fact from mere observation the two modules are not distinguishable. Both also produce the same amount of electricity with substantially the same temperature difference. The important difference is that in the FIG. 2B-type module, the quantity of expensive thermoelectric material is reduce by about half. For reasons discussed below the heat flow through FIG. 2B-type module of the present invention may be about 3 percent greater reducing the efficiency of the module by about 3 percent. But in most applications this reduction would not be noticed and the loss of 3 percent of the heat would not be a concern. After all, without the present invention all the heat would be wasted because there has not in the past been a thermoelectric module on the market that could be purchased at a low enough price to make any energy recovery practicable in most potential applications.

The p and n legs shown in FIG. 2A are 0.21 in ×0.21 in ×0.118 in for a volume of about 0.0052 in$^3$ and an l/A ratio of 2.68. The p and n legs shown in 2B are 0.182 in ×0.182 in ×0.088 in for a volume of about 0.0029 in$^3$ and an l/A ratio of 2.68, the same as the FIG. 2A legs. With the FIG. 2B design Applicants have reduced the quantity of thermoelectric material by about 44 percent with no change in the l/A ratio. The walls of the egg crate in the parts of the module separating the thermoelectric elements are much thicker so that the total cross sectional area of the elements is less than 75 percent of the total module cross sectional area. In preferred embodiments, the cross sectional area of the elements is only about 50 percent of the total module cross sectional area. Above and below the thermoelectric elements the walls of the egg crate are tapered becoming about as thin at the top and bottom of the egg crate as in prior art designs. The spaces above and below the elements are filled with a high heat and electric conducting material such as aluminum. This produces two generally funnel shaped conductors funneling heat and electric current into and out of each of the thermoelectric elements. Several types of tapers are possible. In the FIG. 2B drawing the shapes are approximately arcs of circles or ellipses. The taper could take a bevel shape. A step type taper is also possible but not recommended.

As with the prior art design the 2B egg crate includes periodic protrusions 52 which are located at the bottom of the element space and hold the elements in their proper positions after they are loaded into the egg crate during fabrication. The elements are loaded from the top position as shown on these drawings.

Figure 2C:
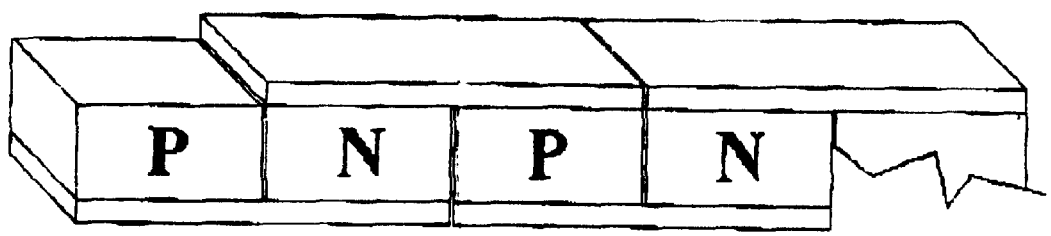
FIGS. 2C and 2D are three dimensional drawings comparing an embodiment of the present invention to a prior art design.
Figure 2D:
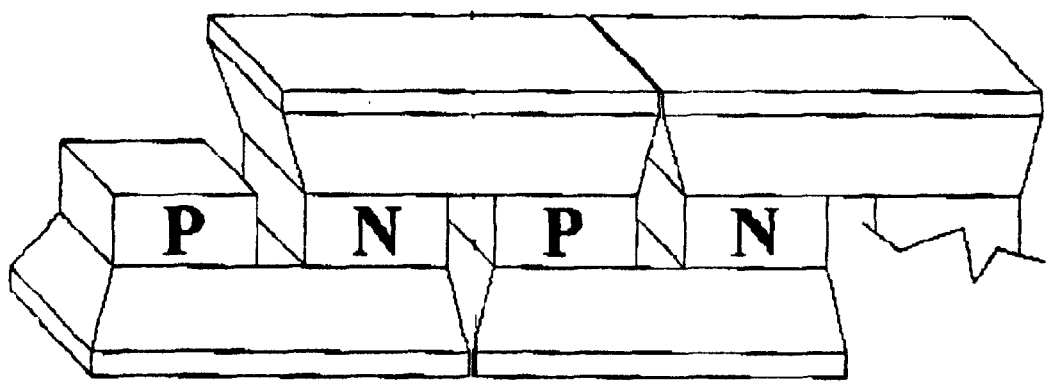

FIGS. 2C and 2D show a three dimensional comparison of the prior art FIG. 2A module to the FIG. 2B embodiment of the present invention.

Same Power with Half the Material And No Significant Increase in Heat Flux through Module Hot and Cold Surfaces An important feature of the present invention is that there is no significant increase in heat flux through the surfaces of the whole module. (Other attempts have in the past been made by Applicants and others to maintain power output with reduced thermoelectric material content. These attempts have involved increased heat flux through the surface of the module.) The thermoelectric material in the prior art FIG. 2A-type module is about 0.5 gm per leg so the total quantity is about 50 gm. A module according to the present invention with the configuration shown in FIG. 2B would use only about 25 gm. The heat flux with the prior art FIG. 2A module under standard conditions of 250 C. hot side and 50 C. cold side is 9.5 W/cm$^2$. With the heat flux as indicated above, the heat flux through the FIG. 2B module surface is substantially the same as the module surface heat flux in the prior art FIG. 2A module. This is very important because an increase in heat flux at the module surfaces means a proportional increase in the temperature drop across the electrical insulators (identified as $Al_2O_3$ in FIG. 1C) and the interfaces at both hot and cold surfaces. This temperature drop is as much as 15 C. or greater at each surface in many applications. A 25 percent increase in heat flux therefore would increase the total surface temperature drop to about 37 C., and that would cause a 8% or greater reduction in performance. In the module of the present invention the only significant heat flux increase is across the thermoelectric elements (by about 25 percent in the FIG. 2B example). But this increase in heat flux here has no effect on performance because there is no significant temperature drop across the interface between the aluminum coating and the face of the thermoelectric element and because the l/A ratio has been maintained.

As stated above this embodiment of the present invention makes very efficient use of expensive thermoelectric material. About 13 Watts are generated with only about 25 grams of material at the standard conditions of 250 C. hot surface and 50 C. cold surface. This works out to 0.56 Watts/gm as compared to about 0.28 Watts/gm with the comparison prior art module.

Limits on the Invention—Efficiency and Stresses

The Applicant's present discovery of a method of major cost reductions with no significant compromises in performance is an extremely important development that is expected to at least double the available market for thermoelectric modules. Applicant's consider it the most important development in the thermoelectric industry since Applicants developed the gap-less egg crate about four years ago which permitted a 50 per cent reduction in the module cost because it greatly reduced labor costs. However the size of the elements cannot be reduced without limit.

Smaller elements with the same size modules means the walls of the egg crate are thicker and there will be some compromise of conversion efficiency. In the prior art module the walls represent 21 percent of the module cross section area with the elements comprising 79 percent. In the 2B design the walls represent 35 percent of the cross section area and the elements 65 percent. The egg crate material is DuPont Zenite® which is a liquid crystal polymer. Zenite® has a published thermal conductivity of 0.3 W/mK. The bismuth telluride alloy thermoelectric elements have an effective thermal conductivity of about 1.5 W/mK that is five times greater than the wall material. As a result of the thicker walls the heat loss through the wall material will increase by about 1.7 times as compared to the 2A prior art design. This results in a decrease of about 3 percent in the module efficiency. This means the heat flow through the module will have to increase about 3 percent to produce the same electrical output as the FIG. 2A type module. Or with the exact same conditions the module will produce about 3 percent less power. In most applications the higher heat flow or the slight reduction in output will be of no consequence. Cost savings, on the other hand will be about 20 to 30 percent and this cost savings will in many cases make thermoelectric energy practical where it otherwise would have been impractical.

In a typical application the hot side of the thermoelectric element is 250 C. and the cold side is 50 C. The smaller the element the greater the stress caused by this temperature difference. Applicants have tested elements having dimensions discussed above and elements having dimensions such as these can handle the stresses without any significant reduction in useful lifetime. However, further reductions in sizes of the elements when thermally stressed by the 250 C. temperature drop could present problems of cracking in the elements.

Making the Egg Crate

Figure 5:
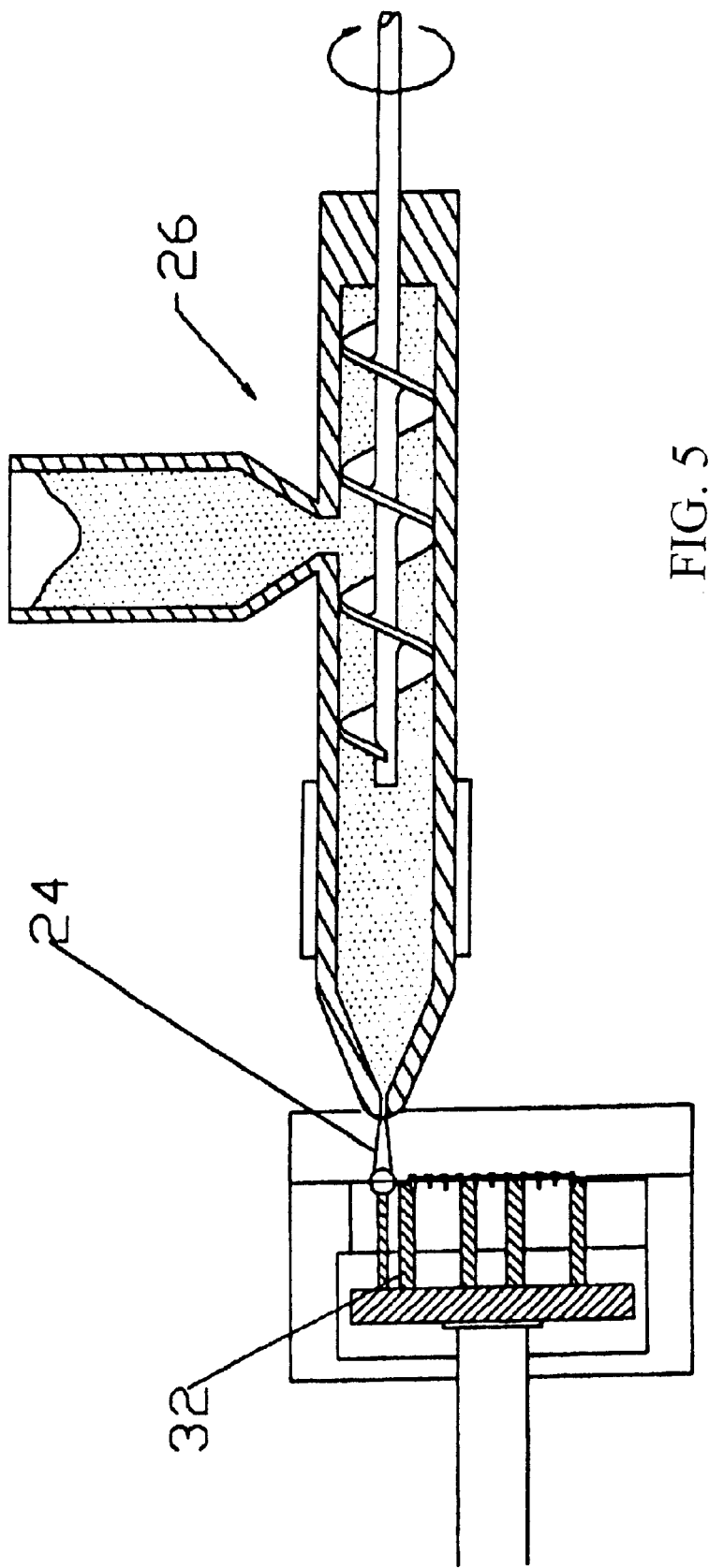
Figure 6:
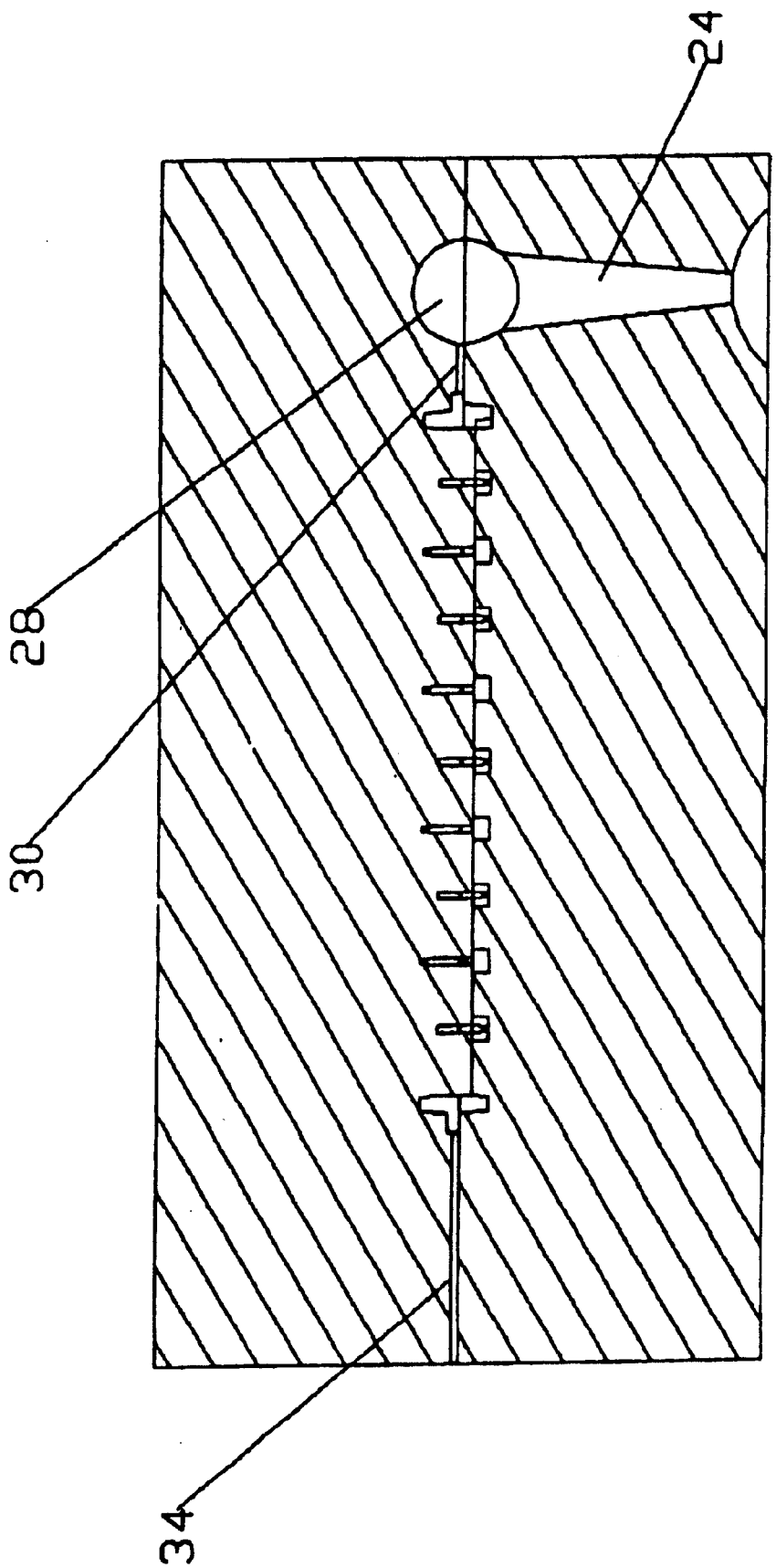

Preferably, the egg crate for modules of the present invention are made in the same manner described in the '210 patent referred to in the background section which patent is incorporated herein by reference. The only significant difference is that the walls are thicker and they are tapered as shown in FIG. 2B. The egg crate is injection molded preferably using the DuPont Zenite® material referred to above and identified in the '210 patent. Applicants have included in this application FIGS. 3A and B, FIGS. 4A and B and FIGS. 5, 6 and 7A and B which are extracted from the '210 patent. These drawings show how the molds are made and used in an injection molding process for making the egg crates. The prior art molds are shown in FIGS. 15A and B and 16A and B. As explained in the '210 patent, the molding fluid plastic passes through sprue 24, runner 28, and gate 30 into the mold cavity. The vent is shown at 34 in FIG. 6. The finished part is ejected using injection pins 32 as shown in FIG. 5. The thicker walls will make molding of the egg crate easier and the small increase in the quantity of egg crate material will not add significantly to the module costs since the egg crate material is much, much less expensive than the thermoelectric material.

Thermoelectric Elements

The smaller thermoelectric elements are available from suppliers of thermoelectric materials such as Melcor Corporation with offices in Trenton, N.J. The elements also may be fabricated using well known techniques such as those described in Thermoelectric Materials edited by Sittig, published in 1970 by Noyes Data Corporation.

Loading the Egg Crate

Figure 1A:
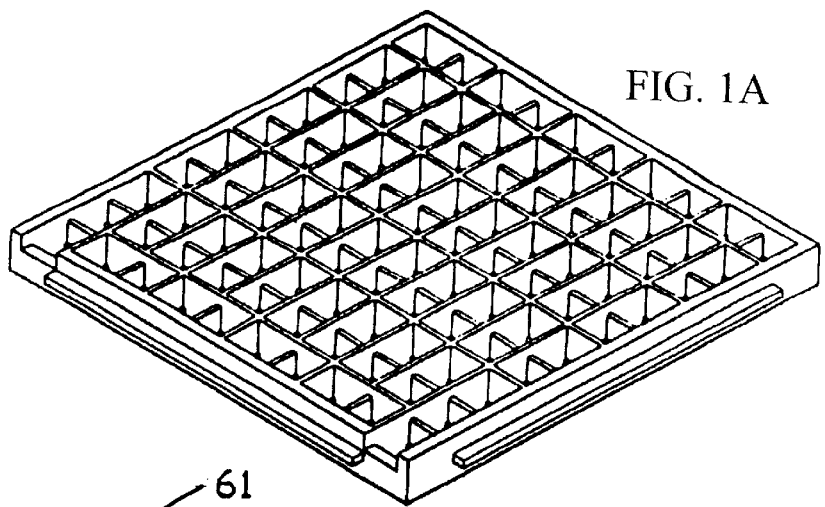
FIGS. 1A, 1B and 1C show features of a prior art egg crate type thermoelectric module.
Figure 1B:
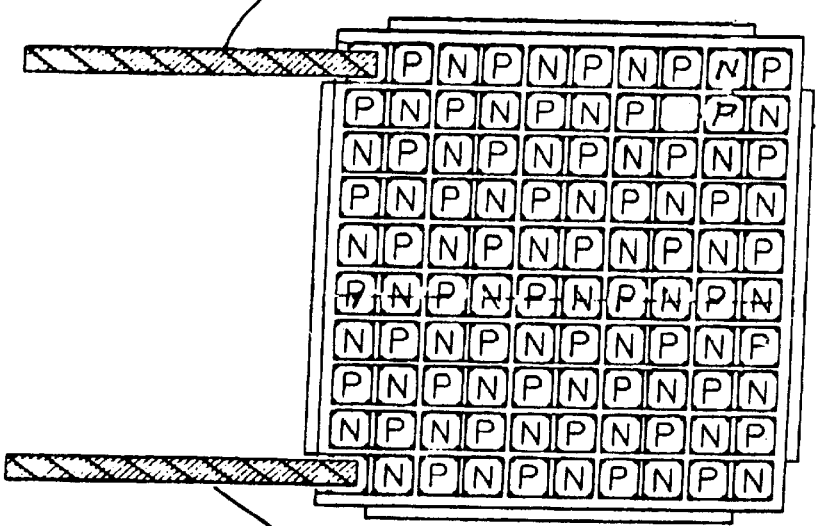

The egg crate preferably is loaded in the same manner as described in the '210 patent and in the configuration shown in FIG. 1B. The main difference is that the walls of the egg crate will be thicker and tapered as indicated in FIG. 2B which will actually make the loading of the elements in to the egg crate much easier and quicker for another significant decrease in the cost of making the module. The elements will preferably be formed into a checkerboard pattern as shown in FIG. 1B.

Metalizing the Hot and Cold Surfaces

The 98 or 100 legs in the egg crate are all connected in series in this preferred embodiment in the same manner as described in the '210 patent. That is, the modules are mounted on a mandrel rotating at 55 rpm as shown in FIG. 7A and B and sprayed using a metal thermal spray coating system as described in Metals Handbook, Ninth Edition published by the American Society for Metals. The preferred coating is a first layer of 0.006-inch layer of molydenum and a second 0.06 inch coating of aluminum. Readers are referred to the '210 patent for greater detail on Applicants' preferred metalizing technique.

Reducing the Surfaces

Figure 1C:
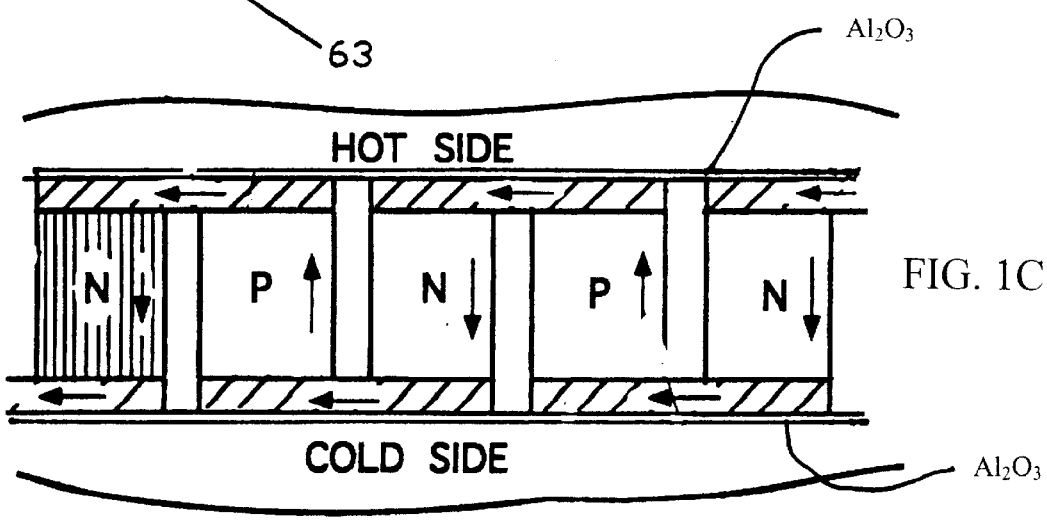

As explained in the '210 patent the surfaces now have to be reduced to expose the egg crate walls to isolate the separate couples from their neighbors as shown in FIG. 1C. This can be done with a precision sanding machine.

Insulation Seal

In most applications the module will be sandwiched between a hot metal surface and a cold metal surface. In these situations an electrical insulating layer (having low thermal resistance) is used such as the thin $Al_2O_3$ film shown in FIG. 1C.

Other Cost Reduction Techniques

Another technique for reducing the cost of fabricating a thermoelectric module that must produce a certain power and voltage is by using a lower priced module with a DC to DC converter. This lower priced module is made up of fewer N & P legs which are larger in cross sectional area (than the higher priced module) to produce the same amount of power. The cost reduction comes about because the number of slicing and dicing steps are reduced and the cerf loss due to slicing and dicing is reduced.

The power out of both modules is the same, but the module with the fewer legs generates less voltage and more current. By using a DC to DC converter, the voltage can be increased to the desired level. These DC to DC converters can be fabricated for a few dollars. Thus the combination of using a lower priced module and a DC to DC converter is a more attractive approach than delivering an expensive module.

Power Production

The preferred embodiment described above when installed as described above between hot and cold surfaces at 250 C. and 50 C. will produce about 13 Watts at a potential of 1.6 Volts. The expected price of the module is about $20 or about $1.43/Watt. Assuming conventional electric power cost of $0.10/KWhr, at this price and with waste heat being utilized, the modules would pay for themselves in less than two years. Applicant expects the market for this module to be enormous.

While the present invention has been described in terms of preferred embodiments, the reader should consider these described embodiments only as particular embodiments. Many other embodiments are possible. For example, many other size reductions could be utilized depending on the application. Very small elements could be used with a greatly increased funneling effect if conversion efficiency is not a concern and if stress issues are dealt with. In such cases the ratio of element cross section to module cross section could be as low as 25 percent or even lower. Therefore, the reader should determine the scope of the present invention by the claims and their legal equivalents.

We claim:

1. A thermoelectric module defining a hot surface a hot surface area, a cold surface and a cold surface area, said module comprising:
   A) a crate having the form of an egg crate defining a plurality of thermoelectric element spaces,
   B) a plurality of p-type thermoelectric elements,
   C) a plurality of n-type thermoelectric elements, said p-type and said n-type thermoelectric elements being positioned in said thermoelectric element spaces in said crate and all of said p-type and n-type thermoelectric elements defining a total element cross sectional area substantially smaller than said hot surface area,
   D) a metallized cold surface coating connecting thermoelectric elements at said cold surface in a desired electrical configuration,
   E) a metallized hot surface coating connecting thermoelectric elements at said hot surface in a desired electrical configuration,
wherein said metallized cold surface coating and said metallized hot surface coating form heat funnels between said hot and cold surfaces and said thermoelectric elements resulting in heat fluxes through said thermoelectric elements substantially larger than heat fluxes across said hot and cold surfaces.

2. A module as in claim 1 wherein said element cross sectional area is less than 60 percent of said hot surface area.

3. A module as in claim 1 wherein said element cross sectional is less than 50 percent of said hot surface area.

4. A module as in claim 1 wherein said element cross sectional is less than 40 percent of said hot surface area.

5. A module as in claim 1 wherein said element cross sectional is less than 25 percent of said hot surface area.

6. A module as in claim 1 wherein said crate is configured with walls that are tapered above and below said thermoelectric spaces.

7. A module as in claim 6 wherein a cross section of said taper is in the shape of an arc.

8. A module as in claim 7 wherein said arc is the arc of an ellipse.

9. A module as in claim 1 having an output ratio of power output to grams of thermoelectric material of substantially more than 0.28 $Watts_e$/gm.

10. A module as in claim 1 capable of generating about 13 Watts with a hot surface temperature of 250 C. and a cold surface temperature of 50 C. and a heat flux of 9.5 $Watts/cm^2$ or less, wherein all of said plurality of n-type thermoelectric elements and all of said p-type thermoelectric elements comprise substantially less than 50 grams of thermoelectric material.

11. A module as in claim 10 wherein said thermoelectric elements comprise less than 40 grams of thermoelectric material.

12. A module as in claim 10 wherein said thermoelectric elements comprise less than 30 grams of thermoelectric material.

13. A module as in claim 10 wherein said thermoelectric elements comprise less than 25 grams of thermoelectric material.

14. A module as in claim 10 wherein said thermoelectric elements comprise less than 20 grams of thermoelectric material.

* * * * *